US006458511B1

(12) United States Patent
Wittig et al.

(10) Patent No.: US 6,458,511 B1

(45) Date of Patent: Oct. 1, 2002

(54) THERMALLY IMAGEABLE POSITIVE-WORKING LITHOGRAPHIC PRINTING PLATE PRECURSOR AND METHOD FOR IMAGING

(75) Inventors: Tobias Wittig, Osterode/Harz (DE); Hans-Joachim Timpe, Osterode/Harz (DE); Celin Savariar-Hauck, Badenhausen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 44 days.

(21) Appl. No.: 09/589,335

(22) Filed: Jun. 7, 2000

(51) Int. Cl.[7] .......................... G03F 7/30; G03F 7/021

(52) U.S. Cl. .......................... 430/302; 430/11; 430/18; 430/175; 101/456; 101/457; 101/467

(58) Field of Search .......................... 430/175, 302, 430/11, 18; 101/457, 467, 456

(56) References Cited

U.S. PATENT DOCUMENTS

| | | | | | |
|---|---|---|---|---|---|
| 2,714,066 | A | | 7/1955 | Jewett et al. | 95/8 |
| 2,946,638 | A | | 7/1960 | Colo | 312/255 |
| 3,847,614 | A | | 11/1974 | Mattor | 96/75 |
| 4,154,614 | A | | 5/1975 | Tsunoda et al. | 96/75 |
| 4,283,475 | A | * | 8/1981 | Kawamura et al. | 430/70 |
| 4,408,532 | A | | 10/1983 | Incremona | 101/456 |
| 4,576,893 | A | * | 3/1986 | Nakakita et al. | 430/457 |
| 4,687,727 | A | | 8/1987 | Toyama et al. | 430/175 |
| 4,877,711 | A | | 10/1989 | Aoai et al. | 430/176 |
| 5,112,743 | A | | 5/1992 | Kamiya et al. | 430/175 |
| 5,491,046 | A | | 2/1996 | Deboer et al. | 430/302 |
| 5,658,708 | A | | 8/1997 | Kondo | 430/288.1 |
| 5,695,905 | A | | 12/1997 | Savariar-Hauck et al. | 430/162 |
| 5,700,619 | A | | 12/1997 | Baumann et al. | 430/175 |
| 5,741,619 | A | | 4/1998 | Aoshima et al. | 430/175 |
| 5,846,685 | A | | 12/1998 | Pappas et al. | 430/156 |
| 5,858,604 | A | * | 1/1999 | Takeda et al. | 430/156 |
| 5,879,861 | A | * | 3/1999 | Van Damme et al. | 430/162 |
| 5,919,601 | A | | 7/1999 | Nguyen et al. | 430/278.1 |
| 5,925,491 | A | | 7/1999 | Baumann et al. | 430/175 |
| 5,948,596 | A | * | 9/1999 | Zhong et al. | 101/453 |
| 6,218,073 | B1 | * | 4/2001 | Shimizu et al. | 430/273.1 |
| 6,376,150 | B1 | * | 4/2002 | Bolli et al. | 430/165 |

FOREIGN PATENT DOCUMENTS

| | | |
|---|---|---|
| DE | 19644515 | 6/1998 |
| EP | 164128 | 12/1985 |
| EP | 208145 | 1/1987 |
| EP | 672544 | 9/1995 |
| EP | 672954 | 9/1995 |
| EP | 819980 | 1/1998 |
| EP | 819985 | 1/1998 |
| WO | WO9739894 | 10/1997 |
| WO | WO9831545 | 7/1998 |
| WO | WO9911456 | 3/1999 |

OTHER PUBLICATIONS

Beck., F., and Jansen, R., "Intrinsic Redox Behavior of Inert Polymer Layers Filled with Copper Phthalocyanine Pigment", *Advanced Materials*, vol. 3 (1991), pp. 385–388.

* cited by examiner

*Primary Examiner*—John S. Chu
(74) *Attorney, Agent, or Firm*—Baker Botts L.L.P.

(57) ABSTRACT

A radiation-sensitive composition comprises: (i) at least one component capable of absorbing IR radiation; and (ii) a diazonium polycondensation product soluble in an organic solvent; with the proviso that the composition does not contain components capable of reacting with decomposition products produced from IR radiation exposure of the diazonium polycondensation product. The composition may additionally comprise a polymeric binder of the type useful for conventional negative-working printing plates. The composition is suitable for preparing thermally imageable printing plate precursors and printing plates and may also be used in a method for providing an image on such plate precursors and printing plates.

14 Claims, No Drawings

THERMALLY IMAGEABLE POSITIVE-WORKING LITHOGRAPHIC PRINTING PLATE PRECURSOR AND METHOD FOR IMAGING

BACKGROUND OF THE INVENTION

1. Field of the Invention

This invention relates to a radiation-sensitive composition, a thermally imageable positive-working lithographic printing plate precursor having a radiation-sensitive layer obtained by coating a substrate with the radiation-sensitive coating, a method for imaging such a precursor and a lithographic printing plate obtained therefrom. More particularly, the radiation-sensitive composition comprises at least one component capable of absorbing IR radiation, and a diazonium polycondensation product soluble in an organic solvent, with the proviso that the composition does not contain compounds capable of reacting with decomposition products produced from IR radiation exposure of the diazonium polycondensation product. The radiation-sensitive composition may optionally include a polymeric binder of the type which are well known to be useful for conventional negative-working printing plates.

2. Background Information

Today, the demands are quite high on radiation-sensitive compositions which are particularly useable for high-capacity printing plates.

For improving the properties of radiation-sensitive compositions and thus also the corresponding printing plates, basically two methods have been pursued. One of these methods relates to the improvement of the properties of the radiation-sensitive components in the compositions (e.g. diazonium polycondensation products, photopolymers etc.). The other method relates to the detection of new polymeric compounds ("binders"), which are intended to control the physical properties of the radiation-sensitive layers. Particularly the latter method is of crucial importance for printing plates since behavior in the developing and printing processes (such as developability, ink accepting capacity, scratch resistance, and print run stability) is decisively influenced by the polymeric binders. Moreover, such polymeric compounds have a strong influence on the storage stability and radiation-sensitivity of the materials.

In negative-working printing plates, radiation-sensitive compositions are used such that, after image-wise exposure, the exposed areas are cured. During the developing step, only the non-exposed areas are separated from the substrate. In positive-working printing plates, on the other hand, photosensitive compositions are used, the exposed areas of which dissolve faster in a given developer than the non-exposed areas. This process is called photosolubilization. A great number of positive-working radiation-sensitive compositions having quinone diazides and phenolic resins as main components exist.

The latest developments in the field of printing plates deal with radiation-sensitive compositions which can be imaged by lasers. In this type of imaging, films as intermediate information carrier may be omitted since lasers can be controlled by computers.

Plates which are imageable by IR lasers are known from EP-A-0 672 544, EP-A-0 672 954, U.S. Pat. Nos. 5,491,046 and 5,919,601 and EP-A-0 819 985. These plates are negative-working and require a preheating step after imaging whereby the image area of the layer, however, is cross-linked only to a minor extent. To comply with the highest print run demands and to exhibit sufficient resistance to pressroom chemicals, however, a further heating step (i.e. a so-called baking step) is required wherein these layers are further cross-linked. Moreover, these printing plates require the use of highly alkaline developers which are prone to reactions with atmospheric carbon dioxide, thereby necessitating the use of sealed, specialized processing equipment.

U.S. Pat. No. 5,741,619 is an example of a negative-working printing plate containing an IR sensitive composition of an acrylic resin, a diazonium compound and carbon black. However, such formulations require high energy of the IR exposure to yield an image. High energies are also needed for those compositions described in WO 98/31545.

A general disadvantage of these negative-working prior art printing plates is that the image areas are generated by IR exposure, i.e. the curing of the layer depends on the laser exposure. Therefore, variations in the IR exposure such as its intensity directly affect the image areas.

In positive-working systems, this is not the case since the laser only "writes" the background (i.e. non-image area). Regarding the radiation-sensitive compositions of such positive systems, however, there is a certain dilemma. To obtain a high number of copies, cross-linked polymers are required. However, such products are insoluble in the solvents or solvent mixtures usable for coating the plates. Thus, it may be necessary to revert to non-cross-linked or only slightly cross-linked starting products. The required cross-linking is then obtained by preheating steps which can be carried out at different stages of the plate treatment.

A positive-working system has recently been described in EP-A-0 819 980 where it is assumed that the non-image areas are formed by reacting the acid formed with carbon black. The image areas only form during a preheating step. Here, the same applies as above, i.e. the image areas have to be baked to obtain the highest possible number of copies.

Another positive-working system is described in U.S. Pat. No. 5,658,708. The required cross-linking of the layer is carried out during the drying step of the coating. For this, however, the system has to be treated for 10 minutes at 120° C. with chemical processes taking place which finally lead to cross-linking. However, the relatively long dwell times at such high temperatures are an unacceptable expenditure of time in the common fully automatic plate production line. Here, baking does not lead to an increase in the number of copies since the cross-linking is partly reversed.

Further positive-working systems are described in WO 99/11456. The imaged areas of such systems have transient solubility in aqueous alkaline developing systems.

In spite of this intensive research in the field of radiation-sensitive compositions for printing plates, all existing compositions call for improvement. Positive-working printing plates with known compositions usually require a baking step at about 250° C. for obtaining high print run stability. This is a complicated additional process step which sometimes results in warping of the aluminium substrate, "blooming out" of the image or toning problems due to the decomposition of the baking rubber necessary for this process step. Negative-working plates known in the art require a preheat step at about 135° C., where the temperature has to be maintained within a small range of about +/−5° C.

Thus, it is an object of this invention to provide thermally imageable lithographic printing plate precursors, which require less critical steps when preparing an imaged printing plate than methods known in the art and have good storage stability as well as result in imaged plates with high print run stability. It is another object of this invention to provide a radiation-sensitive composition useable on such precursors. Furthermore, it is an object of this invention to provide a method for producing imaged printing plates from such plate precursors. Still another object of this invention is to provide a lithographic printing plate obtained from such plate precursors.

SUMMARY OF THE INVENTION

The thermally imageable positive-working printing plate precursor of this invention comprises an optionally pretreated substrate and a radiation-sensitive layer applied thereon. The radiation-sensitive layer is obtained by coating the substrate with a radiation-sensitive composition which comprises:

(i) at least one component capable of absorbing IR radiation; and (ii) a diazonium polycondensation product soluble in at least one organic solvent and useful for conventional lithographic printing plates, with the proviso that the radiation-sensitive composition does not contain components capable of reacting with the decomposition products produced from the diazonium polycondensation product by exposure to IR radiation. A polymeric binder useful for conventional negative-working lithographic printing plates may optionally be included in the radiation-sensitive composition.

The imaged printing plate of this invention is prepared by a method comprising:

(a) providing a printing plate precursor by coating an optionally pretreated substrate with a radiation-sensitive composition comprising:

(i) at least one component capable of absorbing IR radiation, and (ii) a diazonium polycondensation product soluble in at least one organic solvent and useful for conventional printing plates, with the proviso that the radiation-sensitive composition does not contain components capable of reacting with the decomposition products produced from the diazonium polycondensation product by exposure to IR radiation, (b) imagewise exposing the precursor to IR radiation;

(c) subsequently overall exposing the precursor to UV radiation; and (d) developing the precursor with an aqueous alkaline developing composition to obtain a printable lithographic printing plate.

A polymeric binder useful for conventional negative-working printing plates may optionally be included in the radiation-sensitive composition.

DETAILED DESCRIPTION OF THE INVENTION

The diazonium polycondensation product used in the radiation-sensitive composition of the plate precursors according to this invention is selected from those which are soluble in organic solvents; these diazonium polycondensation products are well-known to those skilled in the art, and are described for instance in U.S. Pat. No. 4,687,727, which is incorporated herein by reference.

The diazonium polycondensation products used in this invention have been previously used for negative-working radiation sensitive lithographic printing plates. They are obtained by a condensation reaction of diazo monomers with aldehydes and precipitation of the reaction product with a certain anion. The condensation product is prepared by condensing one or more diazo monomers such as 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylamino-benzene, 1-diazo-2,5-diethoxy-4-benzoylaminobenzene, 1-diazo-4-N-benzylamino-benzene, 1-diazo-4-N,N-dimethylaminobenzene, 1-diazo-4-morpholinobenzene, 1-diazo-2,5-dimethoxy-4-p-tolyhnercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenyl-amine, 3-(n-propoxy)-4-diazodiphenylamine or 3-(isopropoxy)-4-diazodiphenylamine with a condensing agent such as formaldehyde, acetaldehyde, propionaldehyde, butyric aldehyde, isobutyric aldehyde, benzaldehyde or aldehydes containing one or more carboxylic groups as described in U.S. Pat. No. 5,112,743 (incorporated herein by reference), preferably in a molar ratio of 1:1 to 1:0.5, more preferably 1:1 to 1:0.8, by a conventional process as is well known to those skilled in the art, followed by precipitation with a suitable anion.

Diazonium polycondensation products soluble in organic solvents are for instance obtained by selecting one or more of tetrafluoroboric acid, hexafluorophosphoric acid, hexafluoroantimonic acid, hexafluoroarsenic acid, triisopropylnaphthalenesulfonic acid, 4,4'-biphenyldisulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzene-sulfonic acid or 4-toluenesulfonic acid, etc. as an anion source. Among these, 2,4,6-trimethylbenzene sulfonic acid and 2-methoxy-4-hydroxy-5-benzoylbenzene-sulfonic acid are particularly preferred.

Furthermore, mixed condensation products can be used which, apart from the diazonium salt units, comprise other non-photosensitive units, which are derived from condensable compounds, in particular from aromatic amines, phenols, phenol ethers, aromatic thioethers, aromatic hydrocarbons, aromatic heterocycles or organic acid amides, or combinations thereof.

The term "diazonium polycondensation product" as used herein not only includes diazonium salt condensates but also diazo adducts of a diazo resin with sulfonated acrylic polymers as disclosed in U.S. Pat. No. 5,846,685 and adducts of a diazo resin with sulfonated polyesters as disclosed in U.S. Pat. Nos. 5,846,685 and 4,408,532, which are both incorporated herein by reference.

Especially preferred examples of diazonium polycondensation products are reaction products of diphenylamine-4-diazonium salts, optionally having a methoxy group in the phenyl group bearing the diazo group, with formaldehyde or 4,4'-bis-methoxymethyl-diphenyl-ether, the latter being preferred. The most preferred diazonium polycondensation product is a polycondensation product of 3-methoxydiphenylamine-4-diazoniumsulfate and 4,4'-bis-methoxymethyl-diphenyl-ether, preferably precipitated as mesitylenesulfonate, preferably present in the radiation-sensitive compositions in an amount of from about 1 to about 60 wt % based on the total weight of the composition, more preferably from about 1 to about 30 wt % and most preferably from about 5 to about 20 wt %.

If the diazonium polycondensation product is a diazo adduct as mentioned above, the presence of a polymeric binder is not essential. If the diazonium polycondensation product is a diazonium salt condensate as mentioned above, it is preferred that the radiation-sensitive composition additionally comprises a polymeric binder. If the diazonium polycondensation product is a diazonium salt condensate, it is preferably present in the radiation-sensitive compositions in an amount from about 1 to about 60 wt. % based on the total weight of the composition, more preferably from about 1 to about 30 wt. % and most preferably from about 5 to about 20 wt. %. If the diazonium polycondensation product is a diazo adduct as mentioned above, it is preferably present in an amount from about 80 to about 98 wt. %, more preferably from about 90 to about 97 wt. %.

Any binder known to those skilled in the art to be useful in conventional negative-working plates based on diazonium polycondensation products can be used as the optional polymeric binder. Such binders are alkali-soluble resins. Useful polymeric binders are capable of reacting with the cations produced from UV radiation exposure at the diazonium polycondensation products, however, they are not capable of essentially reacting with the radicals produced from IR radiation exposure at the diazonium polycondensation products. From the standpoint of developability, acryl type resins are preferred, while from the standpoint of durability polyurethane resins and an acetal-modified poly (vinyl alcohol) resin are preferred. Suitable binder materials are for instance disclosed in U.S. Pat. Nos. 5,700,619, 3,847,614, 4,154,614, 5,695,905, 4,877,711, DE-A-19 64 4515, and EP-A-208145, all of which are herewith incorporated by reference. Especially preferred are polyvinylacetal binders comprising the following units A, B and C:

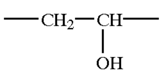
(A)

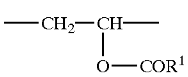
(B)

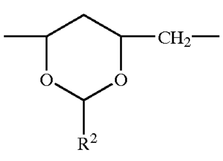
(C)

wherein $R^1$ is H, $C_1$–$C_4$ alkyl, CH═CHCOOH or

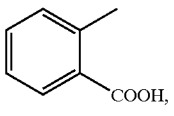

$R^2$ is H, $C_1$–$C_4$ alkyl, aryl, or of the following structure:

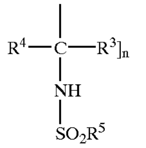
or
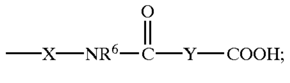

wherein $R^3$ and $R^4$ are independently selected from hydrogen and methyl, n is an integer from 1 to 3, $R^5$ is alkyl, aralkyl, aryl, alkoxyaryl or alkanoyl amide aryl wherein the alkyl moieties have 1 to 8 carbon atoms and the aryl moieties have 6 or 10 carbon atoms, $R^6$ is hydrogen or an aliphatic, aromatic or araliphatic group having 1 to 10 carbon atoms, Y is $—CR^7R^8—CR^9R^{10}—$, $—CR^7═CR^8—$, or of the following structure:

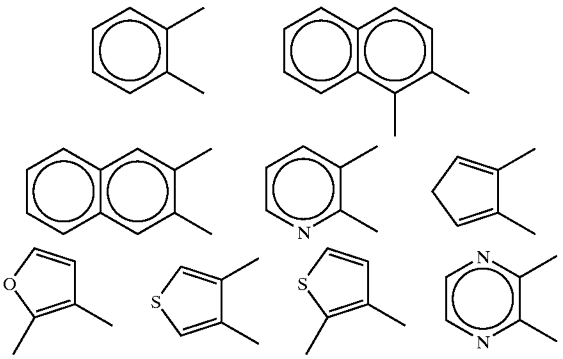

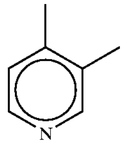
or
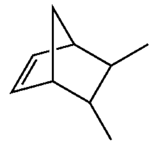

wherein $R^7$, $R^8$, $R^9$, $R^{10}$ each are independently hydrogen or $C_1$–$C_4$ alkyl, and X is $—CH_2$, $—CH(CH_3)$ or $—CH_2CH_2CH_2$.

Units (B) and (C) may be present several times in a polymer molecule with independently selected different groups $R^1$ and $R^2$.

If the polymeric binder is present in the radiation-sensitive composition of this invention, the binder is preferably present in an amount in the range of about 1 to about 95 weight %, more preferably from about 20 to about 90 weight %, and is particularly preferred in amounts ranging between about 30 to 60 weight %, based on the total composition.

Another essential component of the radiation-sensitive compositions is the IR absorbing compound. This compound is a pigment or dye or combination thereof which has an absorption maximum in the IR or near IR range. Such compounds are well known to persons skilled in the art. Preferably, they include organic dyes and/or pigments such as those from the classes of triaryl methane, thiazolium, indolium, oxazolium, cyanine, polyaniline, polypyrrol and polythiophene dyes, or thiolene metal complexes and phthalocyanine complexes. But also other black, yellow, orange, brown, red, violet, blue and green pigments as well as fluorescence pigments and dyes bound to polymers, can be used. Useful IR absorbing compounds preferably have a low oxidation potential, e.g. 0.8 eV (based on standard hydrogen electrode) or lower. Especially preferred are IR dyes of the formula:

(I)

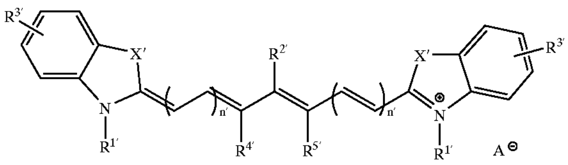

wherein:

each X' independently represents S, O, NR' or C(alkyl)$_2$;

each $R^{1'}$ independently is an alkyl group, an alkylsulfonate or an alkylammonium group;

$R^{2'}$ represents a halogen atom, SR', $SO_2R'$, OR' or $NR'_2$;

each $R^{3'}$ independently represents a hydrogen atom, an alkyl group, COOR', OR', SR', $NR'_2$; a halogen atom, or a substituted or unsubstituted benzofused ring;

A' represents an anion;

$R^{4'}$ and $R^{5'}$ are each a hydrogen atom, or are joined together to form a group which is either $-(CH_2)_2-$ or $-(CH_2)_3-$;

each R' independently represents hydrogen, an alkyl or aryl group; and each n' independently is 0, 1, 2 or 3.

In those embodiments in the present invention in which $R^{4'}$ and $R^{5'}$ are joined together to form a $-(CH_2)_2-$group, the IR dye is represented by the formula:

(II)

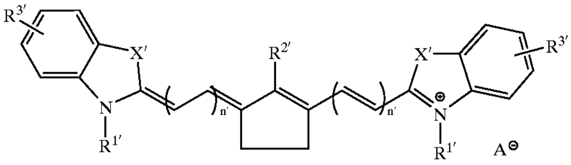

where the remaining variables are as previously defined.

In those embodiments where $R^{4'}$ and $R^{5'}$ are joined together to form a $-(CH_2)_3-$group, six-membered ring, the IR dye is represented by the formula:

(III)

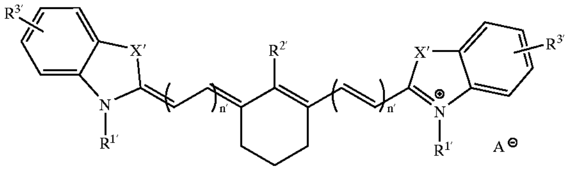

where the remaining variables are as previously defined.

Unless defined otherwise, the term "alkyl" as used herein refers to straight-chain and branched alkyl groups having 1 to 10 carbon atoms. The term "halogen" as used herein includes fluorine, chlorine, bromine and iodine. The term "aryl" as used herein refers to aryl groups having 6 to 14 carbon atoms and includes benzofused ring systems.

The above-described IR dyes of formula I, II or III absorb in the range of 750 to 1100 nm; dyes of formula I, II, or III which absorb in the range of 810 to 860 nm are especially preferred. In a preferred embodiment:

X' is preferably a C(alkyl)$_2$ group;

$R^{1'}$ is preferably an alkyl group with 1 to 4 carbon atoms;

$R^{2'}$ is preferably SR';

$R^{3'}$ is preferably a hydrogen atom;

R' is preferably an alkyl or aryl group; especially preferred is a phenyl group; and A' is preferably a chloride ion or a tosylate ion.

Especially preferred are the following IR dyes:

2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride;

2-[2-[2-thiophenyl-3-[2-(1 ,3-dihydro-1,3,3-trimethyl-2H-indol-2-ylidene)-ethylidene]-1-cyclohexen-1-yl]-ethenyl]-1 ,3,3-trimethyl-3H-indoliumchloride;

2-[2-[2-thiophenyl-3-[2-(1 ,3-dihydro-1,3,3-trimethyl-2H-indol-2-ylidene)-ethylidene]-1-cyclopenten-1-yl]-ethenyl]-1,3,3-trimethyl-3H-indoliumtosylate;

2-[2-[2-chloro-3-[2-ethyl-(3H-benzthiazole-2-ylidene)-ethylidene]-1-cyclohexen-1-yl]-ethenyl]-3-ethyl-benzthiazolium-tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium-tosylate.

The IR absorbing pigments or dyes or combinations thereof, are preferably present in the radiation-sensitive compositions according to the invention in an amount in the range of about 1 to about 30 weight %, particularly preferred from about 5 to about 15 weight %, based on the total composition.

Exposure indicators or dyes for increasing the image contrast or combinations thereof may additionally be used in the radiation-sensitive composition of this invention. It will be understood that such exposure indicators or dyes are distinct and different than the IR-absorbing component of the radiation-sensitive composition.

The exposure indicators which may optionally be used in the radiation-sensitive composition of this invention are known to those skilled in the art, like exposure indicators from the series of triarylmethane dyes (such as Victoria blue BO, Victoria blue R, crystal violet) or diazo dyes (such as 4-phenylazodiphenylamine, azobenzene or 4-N,N-dimethylaminoazobenzene). Preferably, the exposure indicators are present in the radiation-sensitive composition in an amount of about 0.02 to 10 weight %, with about 0.5 to 6 weight % being particular preferred.

As dyes for increasing the image contrast, suitable dyes which optionally may be used in the radiation-sensitive composition of this invention are those which are easy to dissolve in the solvent or solvent mixture used for coating or which can be introduced as pigment in dispersed form. Suitable contrast dyes are, for example, rhodamine dyes, methyl violet, anthraquinone pigments and phthalocyanine dyes or pigments. Preferably, the dyes are present in the radiation-sensitive composition in an amount of 1 to 15 weight %, with 2 to 7 weight % being particularly preferred.

The radiation-sensitive composition according to the present invention is applied to the substrate in the form of a solution prepared by dissolving: (i) at least one IR radiation absorbing component, (ii) the diazonium polycondensation product, and optionally (iii) the polymeric binder, if employed, in a solvent capable of dissolving them. Preferred examples of the solvent include cyclohexanone, cyclopentanone, 2-heptanone, y-butyrolactone, methyl ethyl ketone, ethylene glycol monomethyl ether, ethylene glycol monoethyl ether, 2-methoxyethyl acetate, propylene glycol monomethyl ether, propylene glycol monomethyl ether acetate, methanol, acetone, tetrahydrofuran, methyl lactate and ethyl lactate. These solvents may be used singly or in admixture.

One or more surfactants may be added to the solvent. Specific examples of such surfactants include nonionic surfactants such as polyoxyethylene alkyl ethers, polyoxyethylene-polyoxypropylene block copolymers, fluorine surfactants, organosiloxane polymers and acrylic or methacrylic (co)polymers, which are known for those skilled in the art. The amount of the surfactant or surfactants to be incorporated is usually in the range of about 2parts by weight or less, preferably about 1 part by weight or less, based on 100 parts by weight of solid content of the composition according to the present invention.

The radiation-sensitive compositions according to the invention are preferably useable for the preparation of lithographic printing plate precursors. However, they may also be used for the preparation of integrated circuits, for preparing images on suitable substrates and receptor sheets, for preparing reliefs which can be used as printing forms, sieves and the like.

For the preparation of lithographic printing plate precursors the radiation-sensitive composition is coated on a dimensionally stable substrate. Examples of such a support include paper, paper on which plastic (e.g. polyethylene, propylene, polystyrene) is laminated, a thin plate of metal such as aluminum (including aluminum alloys), zinc, copper, etc., a film of plastic (cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate, polyvinyl acetal), and a paper or plastic on which the metal as described above is laminated. Of these supports, an aluminium plate is preferred over the others since it has markedly high dimensional stability and especially high adhesiveness to the radiation-sensitive layers using the present radiation-sensitive compositions, and is inexpensive. Also, a composite sheet formed by laminating an aluminium sheet on a polymeric film can be used.

When a metal substrate, especially an aluminium plate is used, it is desirable that the substrate undergo a surface treatment such as a graining treatment like brush graining and electrolytic graining, an anodic oxidation treatment, etc; the details of such a treatment are commonly known in the art. To further enhance the hydrophilic properties of the substrate surface, the support may further be treated with a silicate (sodium or potassium silicate) as disclosed in U.S. Pat. No. 2,714,066 (incorporated herein by reference), potassium fluorozirconate as disclosed in U.S. Pat. No. 2,946,638 (incorporated herein by reference), a phosphate, a phosphate/fluoride composition or an organic compound selected from the group consisting of carboxymethyl cellulose, dextrin, gum arabic, amino group-containing phosphonic acids, organic phosphonic acids including polyvinyl phosphonic acid, organic phosphates, amino acids, and hydroxyl group-containing arnine hydrochlorides, etc. These compounds may be used singly or as a mixture of two or more thereof. The details of such a hydrophilizing treatment are well-known to those skilled in the art.

The compositions of the present invention may be applied to the support as formulations containing up to about 20% total solids by coating methods well known in the art. For example, hopper coating, gravure coating, skim pan/air knife coating, spray coating, and other methods may be used with satisfactory results. The coatings are preferably dried at temperatures up to about 120° C. to give dry coating weights preferably in the range of about 0.5 to about 4 $g/m^2$, with weights from about 0.8 to about 3 $g/m^2$ being particularly preferred.

By coating an optionally pretreated substrate with a radiation sensitive composition according to the present invention, a plate precursor is obtainable which can be used for the preparation of an imaged printing plate. The plate precursor is subjected to a method comprising the following essential steps: imagewise exposure to IR radiation; overall exposure to UV radiation; and developing. It is essential that the overall exposure to UV radiation is carried out after the imagewise exposure to IR radiation, not before.

In the first exposure step, the lithographic printing plate precursors of this invention are imagewise exposed by a radiation source that emits in the infrared region; i.e. between about 800 nm and about 1100 nm. Preferably, the infrared radiation source is a laser or laser diode. Such a laser beam may be digitally controlled to imagewise expose the imaging layer. In this context, the lithographic printing plate precursors of this invention are uniquely used for "direct-to-plate" imaging. Direct-to-plate systems utilize digitized information, as stored on a computer disc or computer tape, which is intended to be printed. The position of the exposure beam, in turn, may be controlled by a rotating drum, a leadscrew, or a turning mirror. The exposure beam is then turned off in correspondence with the pixels to be printed. The exposing beam is focused onto the imaging layer of the unexposed plate precursor.

After the imagewise IR exposure, the lithographic printing plate precursor is overall irradiated by a radiation source that emits between 350 nm and about 500 nm. Examples of a radiation source of active rays used for such flood exposure include a doped or non-doped mercury lamp, a metal halide lamp, a xenon lamp, a carbon lamp and so on.

After both exposure steps, the plate precursor is developed using an aqueous alkaline developer. Typical examples of such a developer are those commonly used for conventional negative-working plates. Suitable examples of inorganic and organic alkaline agents used therein include sodium hydroxide, potassium hydroxide, ammonium hydroxide, lithium hydroxide, monoethanolamine, diethanolamine, triethanolamine, monoisopropanolamine, diisopropanolamine, ethyleneimine, ethylenediimine, triethylamine, diethylamine, trimethylamine, dimethylamine, triisopropylamine, pyridine and so on. These alkaline agents can be used alone or in combination of two or more thereof. Various surfactants and organic solvents can be added to the developer for the purpose of accelerating the development, dispersing the developer scum and increasing the ink receptivity in the image area of the printing plate. Examples of surfactants which may be added include anionic, cationic, nonionic and amphoteric surfactants.

When the image recording material of the present invention is used for a printing plate, it is preferred that the plate be subjected to an after-processing with, e.g. wash water, a rinsing solution comprising a surfactant, a desensitizing aqueous solution containing gum arabic or a starch derivative and further additives, after the developing step with the aforementioned developer.

The use of diazonium polycondensation products in IR sensitive compositions is known in the art (see for instance WO 97/39894 and EP-A-164 128). However, the known systems contain compounds capable of reacting with the decomposition products of the diazonium polycondensation products, resulting from their exposure to the radiation which finally leads to a hardening of the exposed areas. In other words, the systems known in the art are used as negative-working systems. In contrast, the present invention refers to a positive-working system based on diazonium polycondensation products typically used in negative-working systems and an IR absorbing compound. In the present invention, the radiation-sensitive composition or layer (in the case of the precursor) does not contain components capable of reacting with the decomposition products produced from the IR radiation exposure of the diazonium polycondensation product.

While not wishing to be bound by any one theory, it is believed that the mechanism of the present invention can be explained as follows: During the imagewise exposure to IR radiation the diazonium polycondensation product is decomposed into such products which are unable to react with the polymeric binder. However, these decomposition products are soluble in alkaline developers. Due to the absence of components capable of reacting with these decomposition products, no cross-linking can occur at the areas exposed to IR radiation. Because the diazonium polycondensation products are destroyed by the imagewise IR exposure, at these areas the crosslinking between diazonium polycondensation products and certain binders cannot occur during the subsequent overall UV exposure. To the contrary, cross-linking takes place in those areas which are not exposed to IR radiation. Therefore, during the developing step those areas imagewise exposed are removed according to the present invention, while in conventional negative-working systems the imagewise exposed areas remain on the substrate. Other IR-sensitive negative systems need a preheat step within a very small temperature range for further curing the image areas to obtain a printing plate with a sufficiently high print run stability. According to the present invention no kind of preheat step is necessary for obtaining a sufficient print run stability.

The invention will now be explained in more detail on the basis of the following examples, but the particular materials and amounts thereof recited in these examples should not be construed to limit this invention in any way.

EXAMPLE 1

A coating solution was prepared from the following components:

| Amount | Component |
|---|---|
| 0.90 g | T71 Resin, according to "Preparative Example 10" of U.S. Pat. No. 5,700,619 (incorporated herewith by reference) |
| 0.15 g | Polycondensation product of 1 mole 3-methoxydiphenylamine-4-diazoniumsulfate and 1 mole 4-,4'-bismethoxymethyldiphenylether, precipitated as mesitylenesulfonate |
| 0.09 g | OB 613 ® available from Orient Chemicals (triarylmethane dye) |
| 0.18 g | 2-[2-[2-thiophenyl-3-[2-(1,3-dihydro-1,3,3-trimethylo-2H-indole-2-ylidene)-ethylidene]-1-cyclohexen-1-yl]-ethenyl]-1,3,3-trimethyl-3H-indoliumchloride |

The stated components were dissolved under stirring in 25 ml of a mixture of 30 parts by volume methylglycol, 45 parts by volume methanol and 25 parts by volume methylethylketone.

After filtration of the solution, it was applied to an electrochemically grained and anodized aluminum foil, which had been aftertreated with polyvinyl phosphoric acid, by means of common procedures, and the layer was dried for 4 min at 90° C. The dry weight of the radiation-sensitive layer was about 1 g/m$^2$.

The thus prepared plate was first imagewise exposed to an IR laser energy between 150 and 200 mJ/cm$^2$ in a Creo Trendsetter 3244 and then subjected to an overall exposure to UV light with an energy of 250 to 500 mJ/cm$^2$ in a Theimer Multimat 064 UV exposing unit.

Subsequently, the plate was treated for 20 seconds with a developer solution consisting of:

| Amount | Component |
|---|---|
| 3.4 parts by weight | Rewopol NLS 28 ® (30% solution of sodium lauryl sulfate in water available from Rewo) |
| 1.8 parts by weight | 2-phenoxyethanol |
| 1.1 parts by weight | diethanolamine |
| 1.0 parts by weight | Texapon 842 ® (42% octylsulfate solution in water available from Henkel) |
| 0.6 parts by weight | Nekal BX Paste ® (sodium salt of an alkyl naphthalene sulfonic acid available from BASF |
| 0.2 parts by weight | 4-toluenesulfonic acid |
| 91.9 parts by weight | water |

Subsequently, the developer solution was again rubbed on the surface with a tampon for 20 seconds and then the entire plate was rinsed with water. After this treatment, the non-IR-exposed parts remained on the plate while the IR-exposed parts were removed completely. The thus prepared plate was fitted into a sheet-fed offset printing machine and under normal printing conditions provided 130,000 copies of good quality. The plate could be further used for printing.

For determining the IR sensitivity, the plate was exposed with an IR laboratory laser diode KY-538 (emitted wavelength 809 nm, Opto Power Corp.). The laser performance of the diode can be varied between 50 and 360 mW by changing the current supplied. The plate was clamped on a drum which rotated at constant speed by means of a motor. By varying the motor output, the rotational speeds could be adjusted to predetermined values. The laser diode was moved mechanically by means of a spindle with lines forming on the plate. This spindle drive could also adjusted according to predetermined values by changing the motor output. By varying current and rotational speed, the plate was exposed with different laser energies. The space between the lines could be modified by varying the adjustment of the rotational speed and the spindle drive. For measuring the basis of the IR sensitivity, the adjustment relating to the laser diode performance and the rotational speed was recorded at which uninterrupted lines form for the last time. Thus, the lower the values of the laser performance and the higher the values of the rotational speed, the higher was the IR sensitivity. The results are summarized in Table 1.

EXAMPLE 2

Example 1 was repeated, however, 0.95 g T71 Resin and 0.10 g polycondensation product were used. This coating composition was treated as in Example 1. The results are given in Table 1.

EXAMPLE 3

In the same manner as described in Example 1 a coating solution was prepared from the following components:

| Amount | Component |
|---|---|
| 0.60 g | CAP ® (cellulose acetate/phthalate) available from Eastman Kodak |
| 0.40 g | Polycondensation product of 1 mole 3-methoxydiphenylamine-4-diazoniumsulfate and 1 mole 4-,4'-bismethoxymethyl-diphenylether, precipitated as mesitylenesulfonate |
| 0.09 g | OB 613 ® available from Orient Chemicals (triarylmethane dye) |
| 0.18 g | 2-[2-[2-thiophenyl-3-[2-(1,3-dihydro-1,3,3-trimethylo-2H-indole-2-ylidene)-ethylidene]-1-cyclohexen-1-yl]-ethenyl]-1,3,3-trimethyl-3H-indoliumchloride |

This coating composition was processed as described in Example 1. The results are given in Table 1.

EXAMPLE 4

Example 3 was repeated, however, 0.70 g CAP® and 0.30 g polycondensation product were used. This coating composition was processed as described in Example 1. The results are given in Table 1.

Comparative Example 1

Analogous to U.S. Pat. No. 5,741,619)

A composition was prepared by dissolving into a mixture of 11.3 ml methanol and 6.3 ml methylethylketone the following:

| Amount | Component |
|---|---|
| 0.24 g | CB disperson, prepared from T71 Resin and Carbon Black (Spezialschwarz 250 ® from Degussa) in a 2:1 ratio, solids content 14.3% in Dowanol PM ® |
| 0.33 g | Polycondensation product of 1 mole 3-methoxydiphenylamine-4-diazoniumsulfate and 1 mole 4-,4'-bismethoxymethyl-diphenylether, precipitated as mesitylenesulfonate |

This coating composition was processed as described in Example 1. The results are given in Table 1.

TABLE 1

IR sensitivities of the coating compositions of Examples 1 to 4 and Comparative Example 1

| Example | Laser Performance | Recording Speed | UV Energy | Result |
|---|---|---|---|---|
| Example 1 | 125 mW | 120 cm/s | 250 $mJ/cm^2$ | positive image |
| Example 2 | 200 mW | 120 cm/s | 250 $mJ/cm^2$ | positive image |
| Example 3 | 125 mW | 120 cm/s | 250 $mJ/cm^2$ | positive image |
| Example 4 | 200 mW | 120 cm/s | 250 $mJ/cm^2$ | positive image |
| Comparative Example 1 | 360 mW | 120 cm/s | 1000 $mJ/cm^2$ | negative image |

According to the method described herein, Examples 1 to 4 resulted in plates with a positive image, i.e. in the non-IR-exposed areas the coating remained and the IR-exposed areas could be removed from the plate without residue within the stated developing times.

It is clear that the replacement of the binder in Examples 3 and 4 only resulted in slight changes of the sensitivity, which can be compensated for by varying the concentration.

The formulation described in Comparative Example 1 required considerably higher IR laser and UV energies to obtain a developer-resistant image. The image formed was negative, i.e. the coating remained only in the IR-exposed areas.

It should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for providing an image comprising:

(a) coating a substrate with a radiation-sensitive composition comprising:

(i) at least one component capable of absorbing IR radiation, and (ii) a diazonium polycondensation product soluble in an organic solvent, with the proviso that the composition does not contain components capable of reacting with decomposition products produced from IR radiation exposure of the diazonium polycondensation product;

(b) imagewise exposing the printing plate precursor obtained in step (a) to IR radiation;

(c) subsequently overall exposing the precursor to UV radiation; and (d) developing the precursor with an aqueous alkaline developing composition.

2. The method according to claim 1, wherein the IR absorbing component is present in an amount of about 1 to about 30 wt % based on the total weight of the radiation-sensitive composition.

3. The method according to claim 1, wherein the diazonium polycondensation product is a diazonium salt condensate which is present in an amount of about 1 to about 60 wt % based on the total weight of the radiation-sensitive composition.

4. The method of claim 1, wherein the diazonium polycondenstation product is a diazo adduct of a diazo resin with sulfonated acrylic polymers or of a diazo resin with sulfonated polyesters, the adduct being present in an amount of about 80 to about 98 wt. % based on the total weight of the composition.

5. The method according to claim 1, wherein the radiation-sensitive composition additionally comprises an alkali soluble resin as a polymeric binder.

6. The method according to claim 5, wherein the polymeric binder is present in an amount of about 1 to about 95 wt % based on the total weight of the radiation-sensitive composition.

7. The method according to claim 1, where the IR absorbing component is a pigment or a dye, or a combination thereof.

8. The method according to claim 1, wherein the IR absorbing component is an IR dye of the formula:

(I)

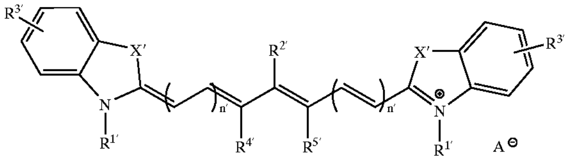

wherein:

each X' independently represents S, O, NR' or C(alkyl)$_2$;

each $R^{1}$' independently is an alkyl group, an alkylsulfonate or an alkylammonium group;

$R^{2}$' represents a halogen atom, SR', $SO_2R'$, OR' or $NR'_2$;

each $R^{3}$' independently represents a hydrogen atom, an alkyl group, COOR', OR', SR', $NR'_2$, a halogen atom or a substituted or unsubstituted benzofused ring;

A' represents an anion;

$R^{4}$' and $R_5$' are each a hydrogen atom, or are joined together to form a group selected from $-(CH_2)_2-$ or $-(CH_2)_3-$;

each R' independently represents hydrogen, an alkyl or aryl group; and each n' independently is 0, 1, 2 or 3.

9. The method according to claim 5, wherein the polymeric binder is a polyvinylacetal binder comprising the following units A, B and C (A)

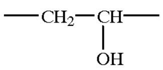

(B)

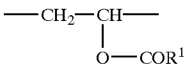

(C)

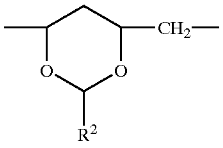

wherein $R^1$ is H or $C_1$–$C_4$ alkyl, CH═CHCOOH or

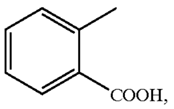

$R^2$ is H, $C_1$–$C_4$ alkyl, aryl, or of the structure:

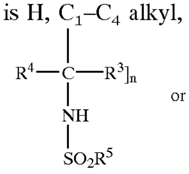

or

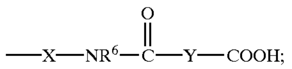

wherein $R^3$ and $R^4$ are independently selected from hydrogen and methyl, n is an integer from 1 to 3, and $R^5$ is alkyl, aralkyl, aryl, alkoxyaryl or alkanoyl amide aryl wherein the alkyl moieties have 1 to 8 carbon atoms and the aryl moieties have 6 or 10 carbon atoms $R^6$ is hydrogen or an aliphatic, aromatic or araliphatic group having 1 to 10 carbon atoms, Y is $-CR^7R^8-CR^9R^{10}-$, $-CR^7=CR^8-$, or of the structure:

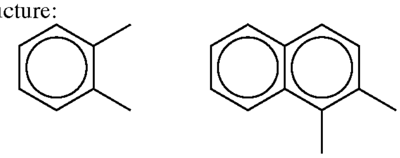

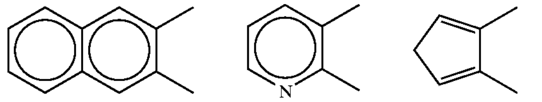

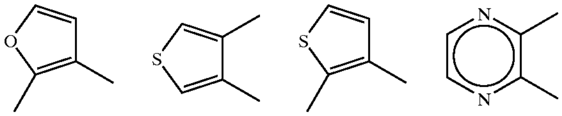

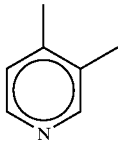

or

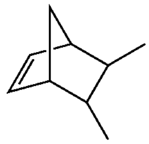

wherein $R^7$, $R^8$,$R^9$, $R^{10}$ each are independently hydrogen or $C_1$–$C_4$ alkyl and X is $-CH_2$, $-CH(CH_3)$ or $-CH_2CH_2CH_2$.

10. The method according to claim 1 further comprising at least one member selected from the group consisting of exposure indicators and dyes for increasing the image contrast.

11. The method according to claim 1, wherein the substrate is a metal or polymeric substrate.

12. The method according to claim 11, wherein the substrate is an aluminium substrate.

13. The method of claim 1, wherein the substrate has been pretreated.

14. The method of claim 12, wherein the aluminium substrate is treated with a silicate, fluorozirconate, phosphate, a phosphate/fluoride composition or an organic compound selected from the group consisting of carboxymethylcellulose, dextrine, gum arabic, amino group-containing phosphonic acids, organic phosphonic acids, organic phosphates, amino acids and hydroxyl group-containing amine hydrochlorides.

* * * * *